United States Patent
Shih et al.

(10) Patent No.: US 6,602,780 B2
(45) Date of Patent: Aug. 5, 2003

(54) METHOD FOR PROTECTING SIDEWALLS OF ETCHED OPENINGS TO PREVENT VIA POISONING

(75) Inventors: Tsu Shih, Hsin-Chu (TW); Yung-Cheng Lu, Taipei (TW); Lih Ping Li, Taipei (TW); Tien-I Bao, Hsin-Chu (TW); Chung Chi Ko, Lan-tou (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 0 days.

(21) Appl. No.: 09/947,788

(22) Filed: Sep. 6, 2001

(65) Prior Publication Data

US 2003/0045124 A1 Mar. 6, 2003

(51) Int. Cl.⁷ ................... H01L 21/4763; H01L 21/302; H01L 21/461
(52) U.S. Cl. .................. 438/637; 438/639; 438/692
(58) Field of Search ................................ 438/637, 639, 438/692

(56) References Cited

U.S. PATENT DOCUMENTS

| | | | |
|---|---|---|---|
| 4,554,644 A | * 11/1985 | Chen et al. ................ | 365/154 |
| 4,944,836 A | * 7/1990 | Beyer et al. ................ | 438/633 |
| 5,472,913 A | * 12/1995 | Havemann et al. ......... | 438/624 |
| 5,960,312 A | * 9/1999 | Morikawa ................... | 438/533 |
| 6,211,069 B1 | * 4/2001 | Hu et al. ..................... | 438/637 |

OTHER PUBLICATIONS

Carter, K.R., et al., "Polymide Nanofoams for Low Dielectric Applications", Apr. 1995, MRS Sym., vol. 381, pp. 79–91.*

* cited by examiner

Primary Examiner—Long Pham
Assistant Examiner—Howard Weiss
(74) Attorney, Agent, or Firm—Tung & Associates

(57) ABSTRACT

A method for forming a protective oxide liner to reduce a surface reflectance including providing a hydrophilic insulating layer over a conductive layer; providing an anti-reflectance coating (ARC) layer over the hydrophilic insulating layer; providing an etching stop layer over the anti-reflectance coating (ARC) layer; photolithographically defining a pattern on a surface of the etching stop layer for etching; anisotropically etching at least one etch opening extending at least partially through a thickness of the hydrophilic insulating layer; depositing an oxide liner such that the sidewalls and bottom portion of the at least one etch opening and said surface are covered by the oxide liner; and, removing the oxide liner from aid surface according to a chemical mechanical (CMP) process to a surface reflectance.

19 Claims, 1 Drawing Sheet

METHOD FOR PROTECTING SIDEWALLS OF ETCHED OPENINGS TO PREVENT VIA POISONING

FIELD OF THE INVENTION

This invention generally relates to semiconductor manufacturing methods and more particularly to an improved method for manufacturing metalization vias and metal interconnects using low-k insulating inter-metal dielectric (IMD) layers.

BACKGROUND OF THE INVENTION

Since the introduction of semiconductor devices, the size of semiconductor devices has been continuously shrinking, resulting in smaller semiconductor chip size and increased device density. One of the limiting factors in the continuing evolution toward smaller device size and higher density has been parasitic effects such as contact resistance in metal interconnects needed to interconnect lines between devices. As a way to overcome such a limitations, methods have been implemented to alleviate damage or other factors caused by etching that may increase the contact resistance in metal interconnects.

In the fabrication of semiconductor devices multiple layers may be required for providing a multi-layered interconnect structure. During the manufacture of integrated circuits it is common to place material photoresist on top of a semiconductor wafer in desired patterns and to etch away or otherwise remove surrounding material not covered by the resist pattern in order to produce metal interconnect lines or other desired features. During the formation of semiconductor devices it is often required that the conductive layers be interconnected through holes in an insulating layer. Such holes are commonly referred to as contact holes, i.e., when the hole extends through an insulating layer to an active device area, or vias, i.e., when the hole extends through an insulating layer between two conductive layers.

Originally, conventional process techniques implemented multilevel interconnection systems by depositing a metal layer, photo-lithographically patterning the deposited metal layer, and then etching the metal layer to form desired interconnections. However, since metals are typically more difficult to pattern and etch than other semiconductor layers such as dielectric or oxide layers, manufacturing processes such as, for example, damascene processes, have been implemented to form metal vias and interconnects by dispensing entirely with the metal etching process. The damascene process is a well known semiconductor fabrication method for forming multiple layers of metalization vias and interconnect lines.

For example, in the dual damascene process, a via is etched in an insulating layer also known as an inter-metal or inter-level dielectric (IMD/ILD) layer. The insulating layer is typically formed over a metal or conductive layer. After a series of photolithographic steps defining via openings and trench openings, the via and the trench openings are filled with a metal (e.g., Al, Cu) to form metalization vias and interconnect lines, respectively. The excess metal above the trench level is then removed by well known chemical-mechanical polishing (CMP) processes.

One problem with the dual damascene process, especially where metal interconnect lines are adjacent to one another thereby making the distance between metal interconnect lines critical as design rules are scaled down, has been the phenomenon of coherent interference effects forming standing waves in the photoresist due to a reflecting underlayer, e.g., the insulating IMD/ILD layer. Light reflecting from an underlying substrate can lead to size variations in the photoresist pattern making it difficult for critical dimension (CD) control. In addition to size variations in the photoresist pattern, reflecting light may lead to undercutting the photoresist during a photoresist patterning process where portions of a photoresist layer that have been unintentionally exposed by scattered or reflected light near the reflecting interface are removed after photoresist development. Undercutting the photoresist layer acts to decrease the spacing between metallic lines, compromising device design and performance. Efforts to address this problem have included adding anti-reflectance coating (ARC) layers over the insulating layer prior to laying down a photoresist layer, thereby reducing unwanted light reflections.

In a typical damascene process, for example, a dual damascene manufacturing process known in the art as a via-first-trench last process, conventional photolithographic processes using a photoresist layer is first used to expose and pattern an etching mask on the surface of an etching stop layer overlying the insulating (IMD/ILD) layer, for etching via openings through the insulating layer. Subsequently a similar process is used to define trench openings that are formed substantially over the via openings which in turn define metallic interconnect lines. The via openings and trench openings are subsequently filled with metal to form metalization vias and metal interconnect lines. The surface may then be planarized by conventional techniques to better define the metal interconnect lines and prepare the substrate for further processing.

As an example of a typical damascene process, for example, a via-first process, a substrate having a first metallic layer is provided. Next, an insulating layer is formed over the substrate, followed by planarization so that the insulating layer thickness matches the depth of the desired via openings. Thereafter, an ARC layer followed by an etching stop layer is formed over the insulating layer. Next, a photoresist layer is formed over the etching stop layer, which is subsequently patterned as an etching mask. The patterned etching stop layer and insulating layer are then anisotropically etched to form via openings through the etching stop layer and insulating layer, where the resulting via openings are in communication with an underlying conductive layer.

After the via holes are etched, but before the holes are filled with a conductive material, the photoresist mask which remains on top of the desired features may be removed by a dry etching method known as a reactive ion etch (RIE) or ashing process in a quartz chamber using a plasma of $O_2$ or a combination of $CF_4$ and $O_2$ to react with the photoresist material.

However, another related problem during via hole etching arises due to the use of low-k (dielectric constant) insulating (IMD/ILD) layers. As semiconductor structure sizes have decreased, the necessity for the use of lower dielectric constant insulating layers has increased since lower dielectric constant materials lessen parasitic effects which can increase signal delay time constants.

In many cases, materials that have physical properties that are otherwise acceptable for use as low-k materials in, for example, an insulting layer, also have the undesirable property of being hygroscopic or have a high affinity for moisture. Thus, during the RIE etching step in an oxygen containing plasma to remove the photoresist used to pattern the via openings or trench openings, the low-k material produces hydrophilic bonds and absorbs moisture. During subsequent metal deposition to fill the via holes and trench openings to form metal interconnects, outgassing of the moisture occurs, causing oxidation of metal contacts resulting in via poisoning, or high resistivity of the via interconnect due to the oxidized metal contacts or interconnects.

To overcome this problem, methods have been developed that, for example, provide a protective etch stop liner deposited conformally over the inside of the via opening after via etching to protect the low-k insulating layer. For example, referring to FIG. 1, is shown a via opening 10 after via etching but prior to depositing an etch liner. The via opening 10 extends from a surface 12 through an etch stop layer 14 (e.g., SiON), and ARC layer 16 (e.g., SiON) and at least partially through an insulating layer 18. FIG. 2 shows the conformally deposited SiON etch liner 20. The SiON etch liner 20 overlies the SiON ARC layer 16 and etch stop layer 14 and is deposited prior to applying photoresist layer 22 for patterning of the trench openings 24 to form metal interconnect lines.

In a typical process, an insulating layer 18 is deposited over a metal conductor layer 26. An ARC layer 16 (e.g., SiON) is then deposited over the insulating layer 18 followed by an etch stop dielectric layer 14 (e.g., SiON). The etch stop layer is then patterned for via etching by using an overlying photoresist mask (not shown). After patterning the etch stop layer with the photoresist layer, the etch top layer can itself be used as a mask in etching the via openings. The via openings are then typically etched through the insulating layer 18. An etch liner 20 (e.g., SiON) is then conformally deposited over the via opening 10. The photoresist layer 22 is then deposited for patterning trench opening 24 to form metal interconnect lines.

It has been the practice in the art to use a nitride containing material such as SiON as the protective etch stop liner. A nitride containing material (e.g., SiON) is also typically used as the ARC layer since it has low light scattering (reflectance) properties. Therefore, the addition of a nitride containing material (e.g., SiON) as the protective etch stop liner over the etch stop layer (also SiON) and ARC layer has the added benefit of minimizing light reflectance during the light exposure of the photoresist.

One drawback and shortcoming of using a nitride-containing material as an etch stop liner has been the fact that nitride containing materials frequently do not have an optimal etching resistance under oxygen plasma conditions during oxygen plasma RIE. As such, unintended etching through of the etch stop liner may occur leading to exposure of the low-k insulating layer which will absorb moisture and result in via poisoning effects during subsequent metal filling processes.

One solution has been to use an oxide liner material in place of the nitride-containing material thereby increasing an etching resistance during oxygen plasma RIE. This solution is offset by the fact that a conformally deposited oxygen liner, likewise deposited over the ARC layer, increases light reflectance during photolithographic light patterning of the photoresist to define the interconnect openings, thereby leading to decreased accuracy in critical dimension (CD) control.

There is therefore a need in the semiconductor processing art to develop a method whereby an improved etch stop liner may be applied to via openings to protect low-k insulating layers, thus avoiding a via poisoning effect while avoiding the undesirable effect of increased light reflectance.

It is therefore an object of the invention to provide a method for improved protection of low-k materials from the effects of oxygen containing plasma RIE while overcoming other shortcomings and deficiencies in the prior art.

SUMMARY OF THE INVENTION

To achieve the foregoing and other objects, and in accordance with the purposes of the present invention, as embodied and broadly described herein, the present invention provides a method for forming a protective oxide liner to reduce a surface reflectance.

In a first embodiment according to the present invention, a method for forming a protective oxide liner includes the steps of: providing a hydrophilic insulating layer over a conductive layer; providing an anti-reflectance coating (ARC) layer over the hydrophilic insulating layer; providing an etching stop layer over the anti-reflectance coating (ARC) layer; photolithographically defining a pattern on a surface of the etching stop layer for etching; anisotropically etching at least one etch opening extending at least partially through a thickness of the hydrophilic insulating layer; depositing an oxide liner such that the sidewalls and bottom portion of the at least one etch opening and said surface are covered by the oxide liner; and, removing the oxide liner from said surface according to a chemical mechanical (CMP) process to reduce a surface reflectance.

In a related embodiment the oxide liner may include at least one material selected from the group consisting of silicon dioxide, TEOS-oxide, boro-phospho silicate glass (BPSG), phospho-silicate glass (PSG), boro silicate glass, (BSG), and undoped silicate glass (USG). Additionally, the oxide liner is deposited at a thickness within a range of about 100 Angstroms to about 1000 Angstroms.

In another related embodiment, the step of removing the oxide includes chemical mechanical polishing. In further related embodiments, the insulating layer includes a material with a dielectric constant less than about 3. Further, the insulating layer is hydrophilic.

In another embodiment according to the present invention, is provided a method for protecting sidewalls during a semiconductor manufacturing process including the steps of: providing at least one anisotropically etched opening extending through an anti-reflectance coating (ARC) layer and at least partially through an underlying insulating layer; conformally depositing an oxide liner over the at least one anisotropically etched opening such that the sidewalls therein including a surface penetrated by said anisotropically etched opening are covered by said oxide liner; and, removing said oxide liner from said surface prior to performing a photolithographic process.

In a related embodiment, the at least one anisotropically etched opening further extends through at least one etching stop layer overlying the ARC layer.

These and other embodiments, aspects and features of the invention will become better understood from a detailed description of the preferred embodiments of the invention which is described below in conjunction with the accompanying drawings.

DETAILED DESCRIPTION OF THE PREFERRED EMBODIMENTS

Figure 1:
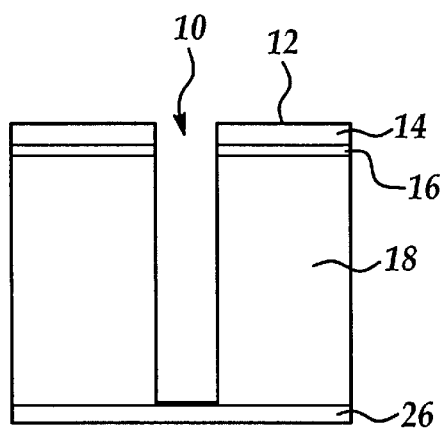
FIG. 1 is a cross sectional view of a portion of a device at a stage in manufacture according to the prior art.
Figure 2:
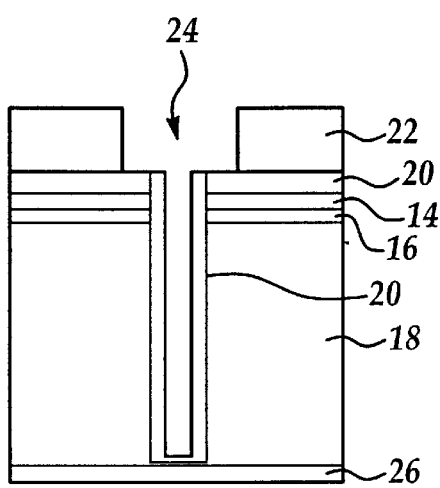
FIG. 2 is a cross sectional view of a portion of a device at a stage in manufacture according to the prior art.
Figure 3:
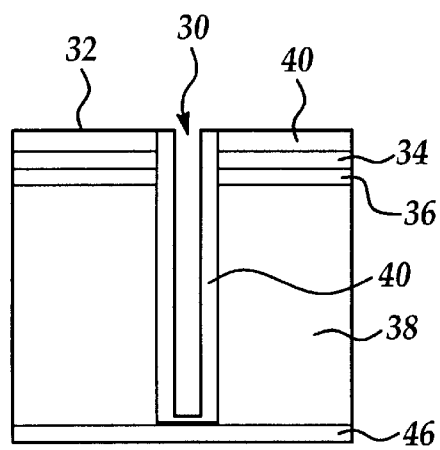
FIG. 3 is a cross sectional view of a portion of a device at a stage in manufacture according to the present invention.
Figure 4:
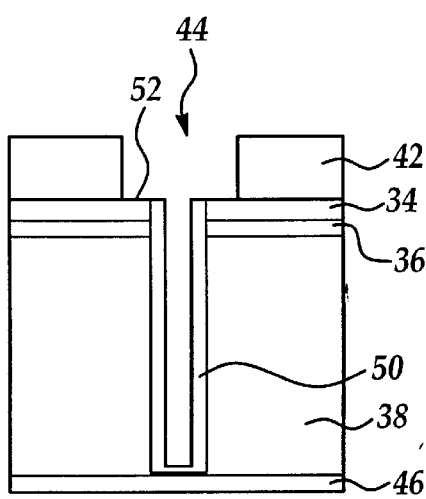
FIG. 4 is a cross sectional view of a portion of a device at a stage in manufacture according to the present invention.

The method and apparatus according to the present invention is more clearly described by referring to FIGS. 3 and 4 which depict a portion of a semiconductor device in different stages in the manufacturing process according to the present invention.

For example, referring to FIG. 3, is shown a via opening 30 after via etching and after depositing an oxide liner 40. The via opening 30 extends from a surface 32 through an etch stop layer 34 (e.g., SiON), and ARC layer 36 (or anti-reflectance layer) (e.g., SiON) and at least partially through an insulating layer 38.

FIG. 3 shows the conformally deposited oxide etch liner 40 according to the present invention. By conformally deposited herein is meant a deposition such that surfaces both horizontally and vertically oriented with respect to a deposition source are covered with the deposition source. The oxide etch liner 40 overlies an ARC layer 36 and etch stop layer 34.

In a typical process, an insulating layer 38 is deposited over a metal conductor layer 46. The insulating layer according to the present invention is preferably a low-k (low dielectric constant) material that will absorb moisture (hydrophilic) under certain plasma processing conditions, for example, an oxygen containing plasma. Examples of low-k inorganic materials include porous oxides, xerogels, or SOG (spin-on glass). Examples of low-k organic materials include polysilsequioxane, parylene, polyimide, benzocyclobutene and amorphous Teflon.

An nitride-containing ARC layer 36 is then deposited over the insulating layer 38 followed by a nitride containing etch stop layer 34. The ARC layer 36 and the etch stop layer 34 each are typically within a thickness range of about 200 to about 2000 Angstroms. Suitable nitride-containing materials for both the ARC layer 36 and the etch stop layer 34 include silicon oxynitride, silicon nitride and titanium nitride. The etch stop layer 34 is then patterned for via etching by using an overlying photoresist mask (not shown). After patterning the etch stop layer 34 with the photoresist layer, the etch stop layer 34 can itself be used as a mask in etching the via opening(s) 30. The via opening(s) 30 are then typically etched through the low-k insulating layer 38. An etch liner 40 is then conformally deposited over the via opening(s) 30.

According to the present invention, the etch liner 40 is an oxide material. A suitable thickness range for the oxide etch liner 40 is in a range of about 100 to about 1000 Angstroms. The etch liner may be formed by APCVD (atmospheric pressure CVD) where the reactant source for forming the silicon oxide layer includes ozone (O3) and TEOS-oxide. Other suitable methods for forming this oxide layer include LPCVD (low-pressure CVD), PECVD (plasma-enhanced CVD) or HDPCVD (high-density plasma CVD) with TEOS-oxide, boro-phospho silicate glass (BPSG), phospho-silicate glass (PSG), boro silicate glass, (BSG), or undoped silicate glass (USG), and so on. The oxide liner 40 may then be densified using a conventional furnace and a rapid thermal process as is well known in the art at a temperature from about 800° C. to 1100° C.

According to the present invention, that portion of the oxide liner 40 extending through a thickness to surface 32 through which the via opening penetrates is removed. FIG. 4 shows the oxide liner 50 according to the present invention after removal of that portion of the oxide liner 40 extending to surface 32 in FIG. 3. Removing the oxide liner 40 extending through a thickness to surface 32 shown in FIG. 3 removes a reflective surface interface 32 and restores an anti-reflectance surface 52 shown in FIG. 4 which includes underlying etching stop layer 34 and ARC layer 36. As a result, further photolithographic processes allow for critical dimension (CD) control. According to the present invention, the oxide layer is preferably removed from the surface by conventional chemical mechanical polishing (CMP) techniques for polishing oxides.

A photoresist layer 42 may then be deposited for patterning trench opening 44 to form metal interconnect lines. The photoresist layer 42 is typically within a range of about 4000 to about 1000 Angstroms.

The preferred embodiments, aspects, and features of the invention having been described, it will be apparent to those skilled in the art that numerous variations, modifications, and substitutions may be made without departing from the spirit of the invention as herein disclosed and more particularly claimed below.

What is claimed is:

1. A method for forming a protective oxide liner to reduce a surface reflectance comprising the steps of:

providing a semiconductor process wafer having a process surface comprising an insulating layer, an overlying anti-reflectance coating ARC layer, and an etching stop layer said process surface further including at least one etch opening extending at least partially through a thickness of the insulating layer;

depositing an oxide liner such that the sidewalls and bottom portion of the at least one etch opening and said process surface are covered by the oxide liner; and, removing the oxide liner from said process surface according to a chemical mechanical (CMP) process while leaving the oxide liner covering the sidewalls and bottom portion to reduce a surface reflectance.

2. The method of claim 1, wherein the oxide liner comprises at least one material selected from the group consisting of silicon dioxide, TEOS-oxide, boro-phospho silicate glass (BPSG), phospho-silicate glass (PSG), boro-silicate glass, (BSG), and undoped silicate glass (USG).

3. The method of claim 1, wherein the oxide liner is deposited at a thickness within a range of about 100 Angstroms to about 1000 Angstroms.

4. The method of claim 1, wherein the insulating layer comprises a material with a dielectric constant less than about 3.

5. The method of claim 1, wherein the anti-reflectance coating (ARC) layer comprises a nitride-containing material selected from the group consisting of silicon oxynitride, titanium nitride, and silicon nitride.

6. The method of claim 1, wherein the etching stop layer comprises a nitride-containing material selected from the group consisting of silicon oxynitride, titanium nitride, and silicon nitride.

7. The method of claim 1, further comprising the steps of depositing a layer of photoresist over the etching stop layer and photolithographically defining a pattern therein including openings situated substantially over the at least one etch opening.

8. A method for forming a protective oxide liner with improved critical dimension control in a subsequent photolithographic process comprising the steps of:

providing at least one anisotropically etched opening extending through an anti-reflectance coating (ARC) layer and at least partially through an underlying insulating layer;

conformally depositing an oxide liner over the at least one anisotropically etched opening such that the sidewalls and bottom portion therein including a surface penetrated by said at least one anisotropically etched opening are covered by said oxide liner;

removing said oxide liner according to a chemical mechanical polishing (CMP) process from said surface while leaving the oxide liner covering the sidewalls and bottom portion prior to performing a photolitographic process; and, depositing layer of photoresist over said surface and photolithographically defining a pattern therein comprising openings situated substantially over the at least one anisotropically etched opening.

9. The method of claim 8, wherein the at least one anisotropically etched opening further extends through at least one etching stop layer overlying the ARC layer.

10. The method of claim 8, wherein the oxide liner comprises a material selected from the group consisting of silicon dioxide, TEOS-oxide, boro-phospho silicate glass (BPSG), phospho-silicate glass (PSG), boro-silicate glass, (BSG), and undoped silicate glass (USG).

11. The method of claim 8, wherein the oxide liner is deposited at a thickness from about 100 to about 1000 Angstroms.

12. The method of claim 8, wherein the insulating layer comprises a material with a dielectric constant of less than about 3.

13. The method of claim 12, wherein the insulating layer comprises a material that is hydrophilic.

14. The method of claim 12, wherein the insulating layer comprises a material selected from the group consisting of polysilsequioxane, parylene, polyimide, benzocyclobutene and amorphous Teflon.

15. The method of claim 8, wherein the ARC layer comprises a nitride-containing material selected from the group consisting of silicon oxynitride, titanium nitride, and silicon nitride.

16. The method of claim 9, wherein the etching stop layer comprises a nitride-containing material selected from the group consisting of silicon oxynitride, titanium nitride, and silicon nitride.

17. The method of claim 1, wherein the oxide liner is densified by an annealing process prior to the step of removing.

18. The method of claim 8, wherein the oxide liner is densified by an annealing process prior to the step of removing.

19. The method of claim 8, wherein the CMP process stops on the etching stop layer.

* * * * *